United States Patent
Waldrip et al.

(10) Patent No.: US 7,560,965 B2
(45) Date of Patent: Jul. 14, 2009

(54) SCANNABLE FLIP-FLOP WITH NON-VOLATILE STORAGE ELEMENT AND METHOD

(75) Inventors: Jeffrey W. Waldrip, Austin, TX (US); Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 126 days.

(21) Appl. No.: 11/741,920

(22) Filed: Apr. 30, 2007

(65) Prior Publication Data

US 2008/0265962 A1    Oct. 30, 2008

(51) Int. Cl.
*H03K 3/289* (2006.01)
*H03K 3/356* (2006.01)

(52) U.S. Cl. ......... 327/202; 327/203; 327/208; 327/218

(58) Field of Classification Search ............ None
See application file for complete search history.

(56) References Cited

U.S. PATENT DOCUMENTS

| | | | |
|---|---|---|---|
| 4,782,283 A * | 11/1988 | Zasio ............... 714/726 |
| 5,334,880 A | 8/1994 | Abadeer et al. |
| 5,677,917 A * | 10/1997 | Wheelus et al. ........ 714/726 |
| 6,114,892 A * | 9/2000 | Jin ..................... 327/202 |
| 6,208,509 B1 | 3/2001 | Cha |
| 6,258,700 B1 | 7/2001 | Bohr et al. |
| 6,373,771 B1 * | 4/2002 | Fifield et al. ........ 365/225.7 |
| 6,639,827 B2 * | 10/2003 | Clark et al. ............ 365/154 |
| 6,989,702 B2 * | 1/2006 | Ko et al. ................ 327/203 |
| 7,394,687 B2 * | 7/2008 | Bertin et al. ......... 365/185.08 |
| 2005/0013187 A1 | 1/2005 | Anand et al. |
| 2008/0024184 A1 * | 1/2008 | Wang ..................... 327/202 |

OTHER PUBLICATIONS

U.S. Appl. No. 11/400,417 filed Apr. 7, 2006.

* cited by examiner

*Primary Examiner*—Tuan Lam
(74) *Attorney, Agent, or Firm*—Robert L. King; Daniel D. Hill

(57) ABSTRACT

A circuit has a master latch having an input for receiving an input data signal, and an output. A slave latch has a first input coupled to the output of the master latch, and an output for providing an output data signal. A non-volatile storage element stores a predetermined value. The non-volatile storage element has an output coupled to the first input of the slave latch. The output data signal corresponds to one of either the input data signal or the predetermined value stored by the non-volatile storage element in response to a control signal.

15 Claims, 3 Drawing Sheets

SCANNABLE FLIP-FLOP WITH NON-VOLATILE STORAGE ELEMENT AND METHOD

BACKGROUND

1. Field

This disclosure relates generally to semiconductors, and more specifically, to the testing of semiconductors that store data.

2. Related Art

As integrated circuits evolve and incorporate significantly more amounts of circuitry, the ability to reliably manufacture and use reliable fuses is problematic. For example supply voltage values have dramatically been reduced to the point where voltages are not sufficient to reliably blow or open-circuit fuses that rely on an electric current to activate the fuse. An alternative to current or voltage activated fuses is the use of lasers to activate a fuse. However, laser-activated fuses are not an option once an integrated circuit has been packaged. In contrast, fuses that are activated by an operating voltage may be activated after an integrated circuit has been packaged and functionality previously verified. Various advantages exist for waiting until later in the manufacturing process to activate fuses. For example, custom configuration of an integrated circuit may be accomplished wherein certain functions are either enabled or not enabled. Various redundant circuits may be activated. Additionally, fuses may be used by a purchaser of an integrated circuit to implement proprietary security codes in the integrated circuit as well as to create special identification codes for the integrated circuit.

Additional problems associated with existing fuse circuits that are used with storage devices include an inability to easily and quickly test the functionality of fuses, both before the fuses are activated and afterwards. Significant circuit area and test time is typically required to check the functionality of programmable fuses.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
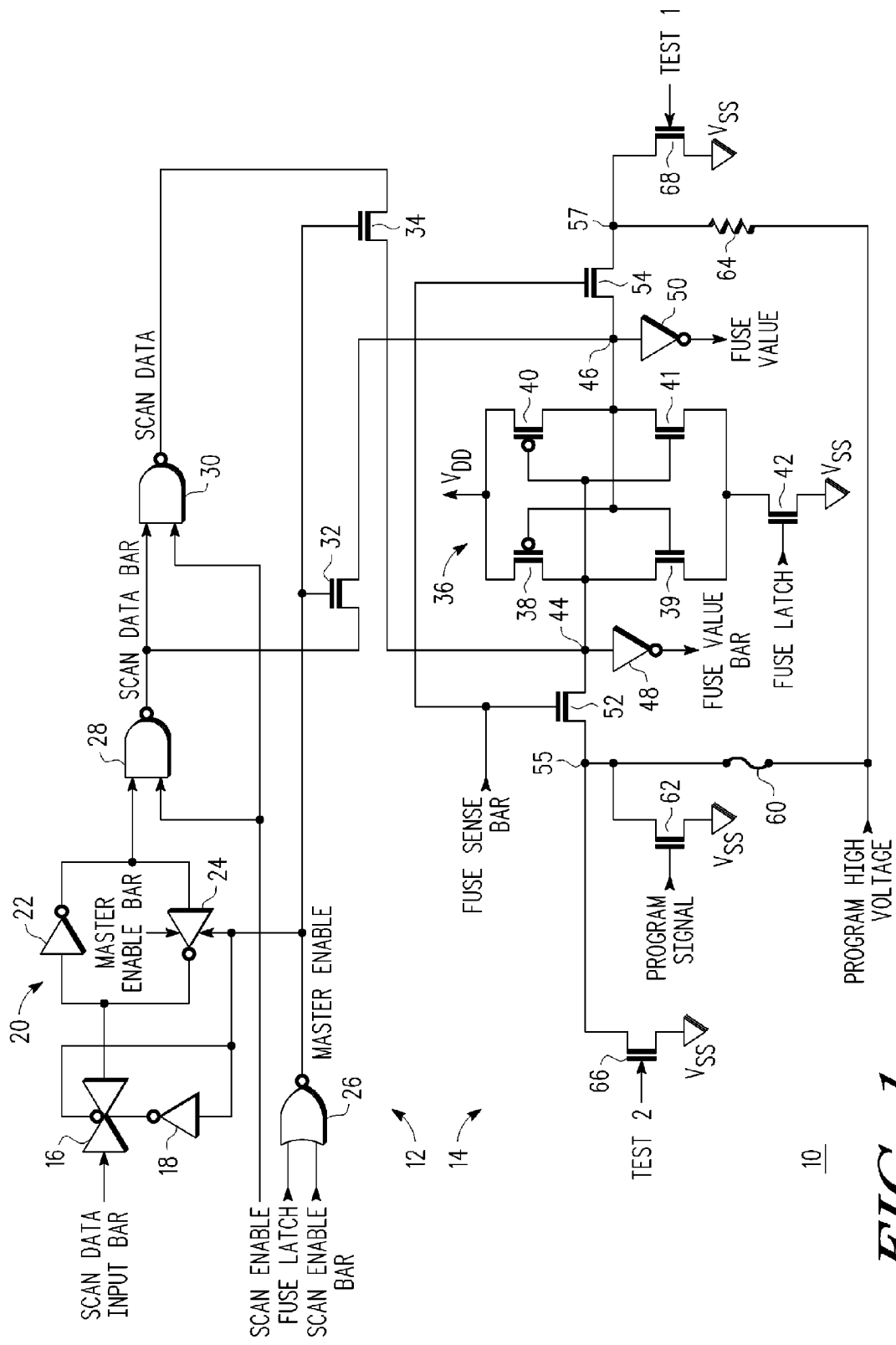
FIG. 1 illustrates in schematic diagram form a scannable flip-flop circuit in accordance with one form of the present invention.

Illustrated in FIG. 1 is a flip-flop 10 generally having a master latch section 12 and a slave latch section 14. Within the master latch section 12 is a transmission gate 16 having an input for receiving scan data in complement form labeled Scan Data Input Bar. An output of transmission gate 16 is connected to an input of a master latch 20. The master latch 20 is formed of inverters 22 and 24. An input of inverter 22 is connected to an output of inverter 24 and to the output of transmission gate 16. An output of inverter 22 is connected to an input of inverter 24 and to a first input of NAND gate 28. A second input of NAND gate 28 is connected to a Scan Enable signal. An output of NAND gate 28 provides Scan Data in complement form (labeled Scan Data Bar) and is connected to a first input of a NAND gate 30. A second input of NAND gate 30 is connected to the Scan Enable signal. An output of NAND gate 30 provides the Scan Data. A NOR gate 26 has a first input for receiving a signal labeled Fuse Latch. A second input of NOR gate 26 has a second input for receiving a signal labeled Scan Enable Bar which is the complement of the Scan Enable signal. NOR gate 26 provides an output signal labeled "Master Enable" which is connected to a first control input of inverter 24, to an input of an inverter 18 and to a P-channel input of the transmission gate 16. An output of inverter 18 is connected to an N-channel input of the transmission gate 16. A complement of the Master Enable signal, Master Enable Bar, is connected to a second control input of the inverter 24. If active, the Master Enable and the Master Enable Bar signals activate inverter 24 and thus master latch 20, such that the master latch 20 can latch an input data signal. In the illustrated form note that if the Scan Enable Bar signal is de-asserted, the Master Enable Bar signal is on a logical level equivalent to the Fuse Latch signal.

The slave latch section 14 has a scan data pass gate 32 having a first current electrode (a drain) connected to the output of NAND gate 28, a control electrode (a gate) connected to the output of NOR gate 26 and a second current electrode (a source) connected to a storage node 46. A scan data pass gate 34 has a first current electrode connected to the output of NAND gate 30, and has a control electrode connected to the control electrode of scan data pass gate 32 and the output of NOR gate 26. A second current electrode of the scan data pass gate 34 is connected to a storage node 44. A latching sense amplifier 36 is formed of a pair of cross-coupled inverters. One of the cross-coupled inverters is formed by series-connected transistors 38 and 39. A second of the cross-coupled inverters is formed by series-connected transistors 40 and 41. A P-channel transistor 38 has a source connected to a power supply voltage terminal for receiving a supply voltage labeled $V_{DD}$. Transistor 38 has a gate connected to storage node 46 and a drain connected to storage node 44. An N-channel transistor 39 has a drain connected to the drain of transistor 38, a gate connected to the gate of transistor 38, and a source connected to a drain of an N-channel transistor 42. A gate of transistor 42 is connected to a signal labeled "Fuse Latch". A source of transistor 42 is connected to a power supply voltage terminal for receiving a voltage labeled $V_{SS}$. A P-channel transistor 40 has a source connected to the terminal for receiving supply voltage $V_{DD}$. A gate of transistor 40 is connected to storage node 44. A drain of transistor 40 is connected to storage node 46. A drain of an N-channel transistor 41 is connected to the drain of transistor 40. A gate of transistor 41 is connected to the gate of transistor 40, and a source of transistor 41 is connected to the drain of transistor 42. An inverter 50 has an input connected to storage node 46 and has an output for providing the Fuse Value signal as an output of the flip-flop 10. An inverter 48 has an input connected to storage node 44 and an output for providing the complementary Fuse Value signal, Fuse Value Bar. A read pass gate 52 is an N-channel transistor having a first current electrode (drain) connected to a node 55, a second current electrode connected to storage node 44, and a gate connected to a nodal terminal for receiving a signal labeled "Fuse Sense Bar" which is a complement of a Fuse Sense signal. A read pass gate 54 is an N-channel transistor having a first current electrode (drain) connected to a node 57, a second current electrode connected to storage node 46, and a gate connected to the nodal terminal for receiving the Fuse Sense Bar signal. A reference resistance 64 has a first terminal connected to a node 57 and a second terminal connected to a terminal for receiving a voltage labeled "Program High Voltage". A first terminal of a fuse 60 is connected to the node 55. A second terminal of fuse 60 is connected to the terminal for receiving the Program High Voltage. An N-channel program transistor 62 has a drain connected to storage node 55, a gate for receiving a Program Signal, and a source connected to a terminal for receiving a supply voltage $V_{SS}$. In the illustrated form the voltage $V_{SS}$ has a lower voltage value than $V_{DD}$. In one form the voltage $V_{SS}$ is an earth ground. A test transistor 66 is an N-channel transistor having a drain connected to node 55, a gate for receiving a test signal labeled "Test 2" and a source connected to the terminal for receiving voltage $V_{SS}$. A test transistor 68 is an N-channel transistor having a drain connected to node 57, a gate for receiving a test signal labeled "Test 1" and a source connected to the terminal for receiving voltage $V_{SS}$. The reference resistance 64, in one form, is implemented as a plurality of individual fuse elements that are connected in series. Each of these fuse elements are similar to the fuse 60 and thus will track with process and temperature variations with respect to their resistance characteristics. Other implementations of the reference resistance 64 may be used.

In operation, flip-flop 10 functions in either of two modes of operation in addition to writing the fuse 60. Flip-flop 10 is a scannable flip-flop that can be loaded with the state of fuse 60 or can be scanned to store data that is received as Scan Data by transmission gate 16. The storage of data is implemented, in one form, with a latching sense amplifier 36. The latching sense amplifier 36 uses the state of the reference resistance 64 and compares the reference resistance state to the state of the fuse 60. When reading the fuse state, whether fuse 60 has been programmed to be electrically open or conductive determines a logic value at the output of the latching sense amplifier 36 at nodes 44 and 46.

Figure 2:
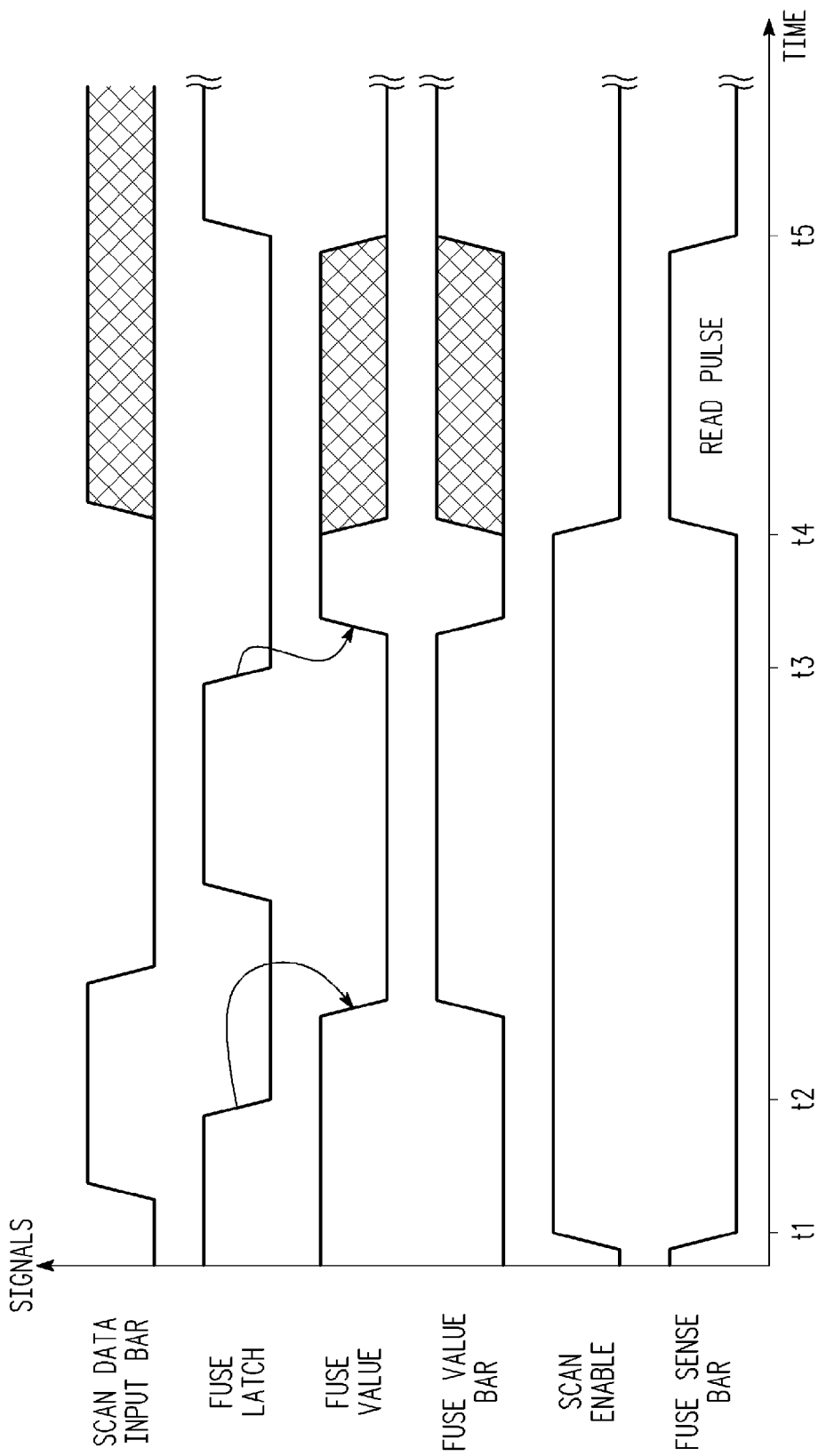
FIG. 2 illustrates in graphical form waveforms associated with the flip-flop circuit of FIG. 1.

The data scan mode will first be described in detail in reference to FIG. 2. In the data scan mode, the Scan Enable signal becomes active starting at a time t1 and therefore Scan Enable Bar is a logic zero. As illustrated in FIG. 2, assume that the Fuse Latch signal is also active at time t1 and assumes a logic one value. Therefore, NOR gate 26 has a logic low output which makes the transmission gate 16 conductive. The complement Scan Data Input (Scan Data Input Bar) is thus coupled to the master latch 20 for storage and is provided to the first input of NAND gate 28. Assume that the complement Scan Data Input is a logic one at least before a minimum setup time prior to a time t2. Therefore the complement Scan Data Input may be either a logic zero or a logic one at time t1. In the illustrated embodiment the complement Scan Data Input is a logic zero at time t1 and transitions to a logic one after time t1 and prior to the setup time preceding time t2. Because the Scan Enable signal is also active, the output of NAND gate 28 is a logic one. Thus the output of NAND gate 30 is a logic zero. After these logic conditions are established, the Fuse Latch signal becomes inactive at time t2 and transitions to a logic zero. In this embodiment data is scanned or shifted in response to a falling edge of the Fuse Latch signal. It should be understood that in other forms a rising edge could be used to shift data. The complement of the Scan Enable signal remains low from time t1 through time t4. Thus the output of NOR gate 26 is a logic one and makes the scan data pass gates 32 and 34 conductive. This circuit condition results in node 44 having a logic zero coupled thereto and node 46 having a logic one coupled thereto. The value of the Fuse Value Bar signal thus transitions to a logic one value and the Fuse Value signal is a logic zero. As illustrated in FIG. 2 further subsequent to time t2 the Fuse Latch signal transitions from a low to a high value. The rising edge of the Fuse Latch signal has no effect on the circuitry. At time t3 the Fuse Latch signal transitions to a low value. The falling edge of the Fuse Latch signal affects the Fuse Value signal which transitions back to a high value subsequent to time t3. During the data scan mode of operation from time t1 to time t4, the read pass gates 52 and 54 are electrically nonconductive as a result of the Fuse Sense Bar signal being a logic zero. Thus the states of the fuse 60 and the reference resistance 64 are irrelevant. There is herein provided a scannable flip-flop 10 that functions to efficiently transfer a stored logic value within the master latch 20 to the slave latch section 14. In the data scan mode of operation the Program High Voltage signal (i.e. the Program Signal) is at a ground or $V_{SS}$ voltage.

Another mode of operation within the scannable flip-flop 10 is the programming of a predetermined state into fuse 60. Fuse 60 is either written to be a one by opening the fuse or is permitted to be a zero by leaving the fuse 60 conductive. Program transistor 62 functions to selectively program the fuse 60 in response to the Program Signal. The Program Signal makes the program transistor 62 conductive. When a sufficiently high Program High Voltage is applied to the second terminal of fuse 60, the fuse will conduct a large amount of current through program transistor 62 to ground. The current from the Program High Voltage is sufficient to make fuse 60 nonconductive by opening or blowing the fuse 60. In this way, the fuse 60 is capable of being written by application of a sufficiently high voltage for the Program High Voltage. It should be understood that the voltage value of the Program High Voltage is not necessarily a high value and is process dependent. For example in some processes where the supply voltage is one volt, the Program High Voltage may be in the range of three volts. Thus, the fuse 60 may be programmed at any time including after the completion and packaging of the scannable flip-flop circuit 10. In the Program mode of operation, a relatively high voltage is coupled to each of pass gates 52 and 54 and transistors 62, 66 and 68. Therefore, these transistors are fabricated to have thicker gate oxides than the other transistors within the scannable flip-flop 10.

In the fuse read mode, the Scan Enable signal illustrated in FIG. 2 is held at a low value beginning at time t4. In this configuration, the output of NAND gate 28 becomes a logic one and the output of NAND gate 30 is also a logic one. Although the output of NOR gate 26 is a logic zero which makes the scan data pass gates 32 and 34 nonconductive, there may none the less be some leakage current through scan data pass gates 32 and 34. With the outputs of both NAND gates 28 and 30 providing a one, there is balance established so that no offset voltage is placed onto latching sense amplifier 36. The Fuse Sense Bar signal is at a logic high value during the fuse read mode. The Fuse Sense Bar signal remains high for a predetermined amount of time that is indicated in FIG. 2 as a Read Pulse. In FIG. 2 the Read Pulse is illustrated as existing between a time t4 and a time t5. At time t5 the Fuse Latch signal transitions to a high logic value (i.e. logic one). The Fuse Latch signal triggers the latching sense amplifier 36 to latch the values at nodes 44 and 46 when it becomes asserted. The Fuse Value signal is representative of the value at node 46 and the Fuse Value Bar signal is representative of the value at node 44 and represents outputs of the flip-flop 10. It should be understood that a same latch circuit in the form of latching sense amplifier 36 has been used for both the reading of programmed fuse data and the scanning of data in a data scan mode.

In one form test transistors 66 and 68 may be added to the flip-flop 10. Assume that fuse 60 has been blown and is highly resistive. In this programmed state the Fuse Value signal should assume a one and the Fuse Value Bar signal assume a zero. Should fuse 60 however not have been adequately opened as an open circuit, the transistor 66 can detect a marginally programmed fuse. To test for this condition the Test 2 signal is used to make test transistor 66 conductive. When made conductive, transistor 66 draws some current to the $V_{SS}$ supply voltage and lowers the voltage potential at both nodes 44 and 55. In the event fuse 60 is marginally programmed, these nodes assume a lower voltage than they should. As a result, the voltage would not be sufficiently high to keep transistor 66 from pulling these two nodes to a lower voltage so that sense amplifier 36 would output incorrect logic values. The Test 1 signal is used to test a condition where the reference resistance 64 does not have adequate high resistance. When the Test 1 signal is a logic high, test transistor 68 is made conductive and provides an additional current path to supply voltage $V_{SS}$ from nodes 57 and 46. As a result, the voltage would not be sufficiently high to keep transistor 68 from pulling these two nodes to a lower voltage so that sense amplifier 36 would output incorrect logic values. It should be understood that the use of test transistors 66 and 68 provide additional test capability for the scannable flip-flop 10 and are not necessarily required for operation.

Figure 3:
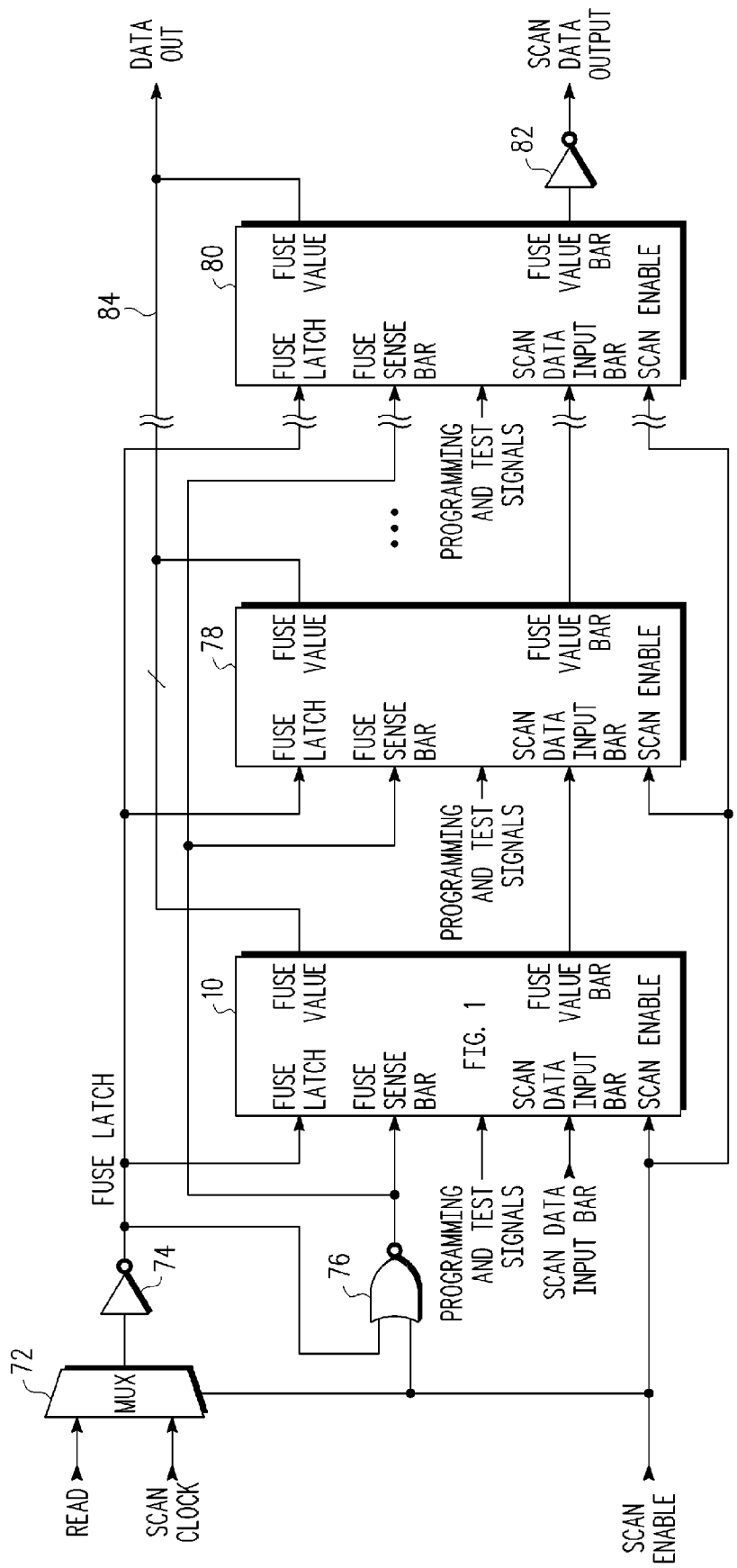
FIG. 3 illustrates in block diagram form a scan chain of flip-flops including the flip-flop of FIG. 1.

Illustrated in FIG. 3 is a scan chain 70 having a plurality of series-connected scannable flip-flops 10, 78 and 80. As indicated by the dots and the breaks in signal lines between flip-flop 78 and flip-flop 80, any number of series-connected flip-flops may be implemented. For example, in one form sixty-four flip-flops may be implemented. In one form each of the scannable flip-flops are the same as scannable flip-flop 10 of FIG. 1. A multiplexer 72, labeled MUX, has a first input for receiving a READ signal, and a second input for receiving a Scan Clock. The Scan Clock is a synchronous clock signal of predetermined frequency. An output of multiplexer 72 is connected to an input of an inverter 74. An output of inverter 74 provides a Fuse Latch signal that is connected to a Fuse Latch input of each of flip-flops 10, 78 and 80. The output of inverter 74 is connected to a first input of a NOR gate 76. A second input of NOR gate 76 is connected to a Scan Enable signal. An output of NOR gate 76 provides a complement Fuse Sense signal and is connected to the Fuse Sense Bar signal input of each of flip-flops 10, 78 and 80. The Scan Enable signal is connected to a control input of multiplexer 72 and to a Scan Enable input of each of flip-flops 10, 78 and 80. Complementary scan data, Scan Data Input Bar, is connected to a Scan Data Input Bar terminal of flip-flop 10. An output of each of flip-flops 10, 78 and 80 provides a Fuse Value and is connected to a bus 84 that provides Data Out in parallel form. Each flip-flop has a second output that provides a Fuse Value Bar signal that is connected to a Scan Data Input Bar terminal of a respective next or successive flip-flop. A Fuse Value Bar output of flip-flop 80 is connected to an input of an inverter 82. An output of inverter 82 provides a Scan Data Output in serial form. Each of the flip-flops, such as flip-flops 10, 78 and 80 has another input for receiving signals labeled "Programming And Test Signals".

In operation, the scan chain 70 is a versatile series of scannable latch elements that can be readily tested without a significant amount of additional circuitry. Multiplexer 72 functions to place the scan chain 70 in either a fuse read mode or a data scan mode of operation in response to the logic value of the Scan Enable signal. When the scan chain 70 is placed in a Read mode of operation, each of flip-flops 10, 78 and 80 functions to provide an output bit onto the multiple-bit bus 84. Thus a plurality of data bits can be read in parallel resulting in a fast read operation.

When the scan chain 70 is placed in a Scan mode of operation by the assertion of the Scan Enable signal, Scan Data is input into the flip-flop 10. The Scan Clock functions to provide the Fuse Latch signal. The Fuse Latch signal functions as a system clock signal that clocks data from flip-flop 10 into flip-flop 78 with the passage of one clock cycle. For sixty-four flip-flops, it takes sixty-four clock cycles of the Fuse Latch signal to clock a data bit from the Data Input Bar input of flip-flop 10 to the Data Input Bar input of the sixty-fourth flip-flop. During the Scan mode of operation the output of NOR gate 76 is held at a logic low value during the entire scan operation. This signal condition functions to maintain the read pass gates 52 and 54 nonconductive and electrically isolate the fuse circuitry from the latching sense amplifier 36. Thus the scan function does not interfere with the fuse circuitry or modify the fuse programming. The disclosed circuit is very efficient in size for large bit implementations. The scan chain operates using a sense amplifier within each flip-flop. The sense amplifier is also used to implement the scan data function during the Scan mode of operation.

By now it should be appreciated that there has been provided a scannable flip-flop circuit and scan chain of flip-flop circuits. Each flip-flop contains a fuse element to provide one-time programming (OTP) functionality. The flip-flop saves circuit area by being scannable without adding a separate scan register. Testing of the flip-flop and the state of the fuses, both before and after programming, is improved. A time consuming programming operation therefore may be avoided if it is determined that the functionality of an unprogrammed fuse element is faulty prior to the fuse programming operation.

In one form there is herein provided a circuit that has a master latch having an input for receiving an input data signal, and an output. A slave latch has a first input coupled to the output of the master latch, and an output for providing an output data signal. A non-volatile storage element stores a predetermined value. The non-volatile storage element has an output coupled to the first input of the slave latch, wherein the output data signal corresponds to one of either the input data signal or the predetermined value stored by the non-volatile storage element in response to a control signal. In another form the non-volatile storage element is one of either a polysilicon fuse or anti-fuse. In another form the master latch, the slave latch, and the non-volatile storage element form a flip-flop for use in a scan chain having a plurality of the flip-flops. In another form the input of the master latch is coupled to an output of a slave latch of a preceding flip-flop of the plurality of flip-flops, and the output of the slave latch is coupled to an input of a master latch of a subsequent flip-flop of the plurality of flip-flops. In one form the slave latch is a latching sense amplifier having a storage node for storing a logic state. A first pass gate has a first current electrode coupled to receive the input data signal, a second current electrode coupled to the storage node, and a control electrode coupled to receive a first control signal. A second pass gate has a first current electrode coupled to the output of the non-volatile storage element, a second current electrode coupled to the storage node, and a control electrode for receiving a second control signal. In another form the latching sense amplifier is a pair of cross-coupled inverters coupled to the storage node. In yet another form the master latch includes a first inverter having an input terminal coupled to receive the input data signal, and an output terminal. A second inverter has an input terminal coupled to the output terminal of the first inverter, an output terminal coupled to the input terminal of the first inverter, and a control terminal for receiving a clock signal. In another form the slave latch is a pair of cross-coupled inverters coupled between a first storage node and a second storage node, wherein the first and second storage nodes provide complementary output data signals. In another form a first pass gate is coupled between the first storage node and the output of the non-volatile storage element. A second pass gate is coupled between the second storage node and a reference element. In another form the reference element is a plurality of series-connected polysilicon fuses.

In another form there is herein provided a plurality of flip-flops, each flip-flop having a master latch, a slave latch, and a non-volatile storage element. A scan enable signal is asserted to enable the plurality of flip-flops to scan data. An input data signal is provided to an input of the master latch. The input data signal is transferred from an output of the master latch, through the slave latch, and to an input of a subsequent flip-flop in the plurality of flip-flops. The scan enable signal is de-asserted and a sense enable signal asserted to couple the non-volatile storage element to the slave latch. A logic state of the non-volatile storage element is stored in the slave latch. The logic state from the slave latch is read. In one form storing and reading the logic state further includes both storing the logic state of the non-volatile storage element in the slave latch and reading the logic state from the slave latch in response to a signal transition, such as a falling edge, of the sense enable signal. In another form reading the logic state from the slave latch further includes reading complementary data signals from the slave latch. In another form reading the logic state from the slave latch further includes reading a logic state of the slave latch of each of the plurality of the flip-flops, wherein in a first mode the plurality of flip-flops are read in parallel and in a second mode the plurality of flip-flops are read in series.

In another form there is provided a circuit having a plurality of flip-flops coupled together. Each of the flip-flops includes a master latch and a slave latch. The master latch has an input for receiving an input data signal, and an output. In one form the master latch has both an output and a complementary output. The slave latch has a pair of cross-coupled inverters coupled between a first storage node and a second storage node. The first and second storage nodes are coupled to the output of the master latch. A non-volatile storage element stores a predetermined value and has an output coupled to the first storage node of the slave latch. A reference element is coupled to the second storage node, wherein the first and second storage nodes provide complementary output data signals corresponding to one of the input data signal or the predetermined value in response to an enable signal. In one form the non-volatile storage element is either a polysilicon fuse or an anti-fuse. In another form the slave latch further includes a first pass gate and a second pass gate. A first pass gate has a first current electrode coupled to the non-volatile storage element, a second current electrode coupled to the first storage node, and a control electrode. A second pass gate has a first current electrode coupled to the reference element, a second current electrode coupled to the second storage node, and a control electrode. In another form the slave latch further includes a third pass gate and a fourth pass gate. The third pass gate has a first current electrode coupled to the output of the master latch, a second current electrode coupled to the first storage node, and a control electrode. The fourth pass gate has a first current electrode coupled to the output of the master latch, a second current electrode coupled to the second storage node, and a control electrode. In another form the master latch includes a first inverter and a second inverter. The first inverter has an input terminal coupled to receive the input data signal, and an output terminal. The second inverter has an input terminal coupled to the output terminal of the first inverter, an output terminal coupled to the input terminal of the first inverter, and a control terminal for receiving a clock signal. In yet another form the input of the master latch is coupled to an output of a slave latch of a preceding flip-flop of the plurality of flip-flops, and the output of the slave latch is coupled to an input of a master latch of a subsequent flip-flop of the plurality of flip-flops.

Although the invention is described herein with reference to specific embodiments, various modifications and changes can be made without departing from the scope of the present invention as set forth in the claims below. For example, various types of one-time programmable (OTP) devices may be used to implement the programming functionality herein. For example, an antifuse may be implemented rather than a fuse. Other types of programmable devices may also be implemented. For example any type of non-volatile storage device may be used. An example would be to substitute any of known read-only-memory (ROM) bit cells in lieu of a fuse or anti-fuse. Floating gate or thin film storage devices may be used and storage devices using nanoclusters or magnetic random access memory (MRAM) may be implemented as well as phase-change memory devices. Various types of transistor devices may be used. While MOS transistors are implemented and discussed herein, transistors that are bipolar, GaAs, silicon on insulator (SOI), carbon nanotubes etc. may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Although the invention has been described with respect to specific conductivity types or polarity of potentials, skilled artisans appreciated that conductivity types and polarities of potentials may be reversed.

The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a master latch having an input for receiving an input data signal, and an output;
   a slave latch having a first input coupled to the output of the master latch, and an output for providing an output data signal, the slave latch comprising a pair of cross-coupled inverters coupled between a first storage node and a second storage node, wherein the first and second storage nodes provide complementary output data signals;
a non-volatile storage element for storing a predetermined value, the non-volatile storage element having an output coupled to the first input of the slave latch, wherein the output data signal corresponds to one of either the input data signal or the predetermined value stored by the non-volatile storage element in response to a control signal;
a first pass gate coupled between the first storage node and the output of the non-volatile storage element; and
a second pass gate coupled between the second storage node and a reference element.

2. The circuit of claim 1, wherein the non-volatile storage element comprises one of either a polysilicon fuse or anti-fuse.

3. The circuit of claim 1, wherein the master latch, the slave latch, and the non-volatile storage element form a flip-flop for use in a scan chain comprising a plurality of flip-flops.

4. The circuit of claim 3, wherein the input of the master latch is coupled to an output of a slave latch of a preceding flip-flop of the plurality of flip-flops, and the output of the slave latch is coupled to an input of a master latch of a subsequent flip-flop of the plurality of flip-flops.

5. The circuit of claim 1, wherein the master latch comprises:
a first inverter having an input terminal coupled to receive the input data signal, and an output terminal; and
a second inverter having an input terminal coupled to the output terminal of the first inverter, an output terminal coupled to the input terminal of the first inverter, and a control terminal for receiving a clock signal.

6. The circuit of claim 1, wherein the reference element comprises a plurality of series-connected polysilicon fuses.

7. In a plurality of flip-flops, each flip-flop comprising a master latch, a slave latch, and a non-volatile storage element, a method comprising:
cross-coupling a pair of inverters between a first storage node and a second storage node for providing complementary output data signals;
coupling a first pass gate between the first storage node and an output of the non-volatile storage element;
coupling a second pass gate between the second storage node and a reference element having one or more polysilicon fuses, the first pass gate and the second pass gate being controlled by a same control signal;
asserting a scan enable signal to enable the plurality of flip-flops to scan data;
providing an input data signal to an input of the master latch;
transferring the input data signal from an output of the master latch, through the slave latch, and to an input of a subsequent flip-flop in the plurality of flip-flops;
de-asserting the scan enable signal;
asserting a sense enable signal to couple the non-volatile storage element to the slave latch;
storing a logic state of the non-volatile storage element in the slave latch; and
reading the logic state from the slave latch.

8. The method of claim 7, wherein storing and reading the logic state further comprises both storing the logic state of the non-volatile storage element in the slave latch and reading the logic state from the slave latch in response to a signal transition of the sense enable signal.

9. The method of claim 7, wherein reading the logic state from the slave latch further comprises reading complementary data signals from the slave latch.

10. The method of claim 7, wherein reading the logic state from the slave latch further comprises reading a logic state of the slave latch of each of the plurality of flip-flops, wherein in a first mode the plurality of flip-flops are read in parallel and in a second mode the plurality of flip-flops are read in series.

11. A circuit comprising:
a plurality of flip-flops coupled together, each of the plurality of flip-flops comprising:
a master latch having an input for receiving an input data signal, and an output;
a slave latch comprising a pair of cross-coupled inverters coupled between a first storage node and a second storage node, the first and second storage nodes coupled to the output of the master latch, the slave latch comprising a pair of cross-coupled inverters coupled between the first storage node and the second storage node;
a non-volatile storage element for storing a predetermined value, the non-volatile storage element having an output coupled to the first storage node of the slave latch; and
a reference element coupled to the second storage node, wherein the first and second storage nodes provide complementary output data signals corresponding to one of the input data signal or the predetermined value in response to an enable signal;
a first pass gate coupled between the first storage node and the output of the non-volatile storage element; and
a second pass gate coupled between the second storage node and the reference element, the first pass gate and the second pass gate each having a control input for receiving a same control signal.

12. The circuit of claim 11, wherein the non-volatile storage element comprises one of either a polysilicon fuse or anti-fuse.

13. The circuit of claim 11, wherein the slave latch further comprises:
a third pass gate having a first current electrode coupled to the output of the master latch, a second current electrode coupled to the first storage node, and a control electrode; and
a fourth pass gate having a first current electrode coupled to the output of the master latch, a second current electrode coupled to the second storage node, and a control electrode.

14. The circuit of claim 11, wherein the master latch comprises:
a first inverter having an input terminal coupled to receive the input data signal, and an output terminal; and
a second inverter having an input terminal coupled to the output terminal of the first inverter, an output terminal coupled to the input terminal of the first inverter, and a control terminal for receiving a clock signal.

15. The circuit of claim 11, wherein the input of the master latch is coupled to an output of a slave latch of a preceding flip-flop of the plurality of flip-flops, and the output of the slave latch is coupled to an input of a master latch of a subsequent flip-flop of the plurality of flip-flops.

* * * * *

UNITED STATES PATENT AND TRADEMARK OFFICE
CERTIFICATE OF CORRECTION

PATENT NO. : 7,560,965 B2
APPLICATION NO. : 11/741920
DATED : July 14, 2009
INVENTOR(S) : Jeffrey Waldrip et al.

Page 1 of 1

It is certified that error appears in the above-identified patent and that said Letters Patent is hereby corrected as shown below:

In the Claims:

Column 10, Line 24, please change "latch; and" to --latch;--

Signed and Sealed this
Fourth Day of June, 2013

Teresa Stanek Rea
*Acting Director of the United States Patent and Trademark Office*